US 6,528,787 B2

(12) United States Patent
Katagami et al.

(10) Patent No.: US 6,528,787 B2
(45) Date of Patent: Mar. 4, 2003

(54) SCANNING ELECTRON MICROSCOPE

(75) Inventors: Masumi Katagami, Tokyo (JP);
Miyuki Kaneyama, Tokyo (JP)

(73) Assignees: Jeol Ltd., Tokyo (JP); Jeol Engineering Co., Ltd., Tokyo (JP)

( * ) Notice: Subject to any disclaimer, the term of this patent is extended or adjusted under 35 U.S.C. 154(b) by 175 days.

(21) Appl. No.: 09/727,357

(22) Filed: Nov. 30, 2000

(65) Prior Publication Data

US 2001/0022346 A1 Sep. 20, 2001

(51) Int. Cl.[7] .......................... G03F 9/00; H01J 37/304
(52) U.S. Cl. ............... 250/310; 250/492.2; 250/492.22; 250/492.3; 250/396 R; 250/398
(58) Field of Search ............... 250/310, 492.2, 250/492.22, 492.3, 396 R, 398

(56) References Cited

U.S. PATENT DOCUMENTS 6,114,695 A * 9/2000 Todokoro et al. ........... 250/310

6,323,498 B1 * 11/2001 Kageyama ............ 250/492.22

FOREIGN PATENT DOCUMENTS

JP          1216204          8/1989

* cited by examiner

*Primary Examiner*—Bruce Anderson
*Assistant Examiner*—Nikita Wells
(74) *Attorney, Agent, or Firm*—Webb Ziesenheim Logsdon Orkin & Hanson, P.C.

(57) ABSTRACT

A scanning electron microscope capable of imaging a specimen at a magnification lower than the minimum magnification of the microscope. The specimen surface is virtually partitioned into cells. The specimen is so moved that the cells can be individually scanned by the electron beam and hence image data can be taken from each cell. Image data derived from each cell by the scan is stored in locations of an image memory that are addressed corresponding to the positions of the cells.

16 Claims, 7 Drawing Sheets

SCANNING ELECTRON MICROSCOPE

BACKGROUND OF THE INVENTION

1. Field of the Invention

The present invention relates to a scanning electron microscope capable of imaging a specimen area wider than an observable area determined by the minimum magnification of the microscope.

2. Description of the Related Art

A scanning electron microscope has an electron gun for producing an electron beam that is sharply focused onto a specimen to be observed. The beam is scanned across the specimen. As a result, secondary electrons and other electrons are produced from the specimen. A specimen image is displayed on the viewing screen of a display device according to the secondary electrons or other electrons.

In such a scanning electron microscope, the magnification can be varied, for example, from a minimum magnification (e.g., tens of times) to a maximum magnification (e.g., hundreds of thousands of times) by varying the size of the region scanned by the electron beam. For instance, where the width of a viewing screen on which an image is displayed is 200 mm, the electron beam is scanned over a distance of 4 mm across the specimen at a magnification of 50×. The beam is scanned over a distance of 1 μm at a magnification of 200,000×.

In a normal imaging method, a wide area of a specimen is imaged at a low magnification to find a portion of interest. Then, a detailed observation is made at this location at a higher magnification. It is convenient to lower the magnification once and to observe a wider area in searching for a portion of interest. Therefore, it is desired to make the minimum magnification as low as possible. To lower the magnification, it is necessary to increase the raster scanning width of the electron beam. If the raster scanning width of the beam is increased, the effect of deflection distortion on the final image increases. Therefore, in a normal scanning electron microscope, the maximum raster scanning width is limited to approximately 5 mm, for example, at which the degree of deflection distortion is tolerable. A correspondingly obtained minimum magnification is about 20× to 30×.

SUMMARY OF THE INVENTION

It is an object of the present invention to provide a novel scanning electron microscope capable of imaging a wide specimen area at a magnification lower than a minimum magnification normally dictated by the raster scanning width of the electron beam.

A first embodiment of the present invention provides a scanning electron microscope having a device for directing a sharply focused electron beam onto a specimen, a device for scanning the electron beam across the specimen in two dimensions, an image memory for storing data about an image of the specimen obtained by the scanning, a means for displaying the image of the specimen according to the data stored in the image memory, and a motor-driven specimen-moving device, the scanning electron microscope being characterized in that it further includes a specimen motion control means, an image-synthesizing circuit, a specifying device, and a partial image display. An image acceptance region is established within the area scanned by the beam. The specimen motion control device virtually partitions an area which is scanned by the electron beam and from which an image should be taken into cells defined by grid lines and can scan these cells individually by the electron beam within the image acceptance region. The image-synthesizing circuit stores image data obtained from these cells in locations of the image memory that are addressed corresponding to the cells, thus creating data about a synthesized image. The specifying device permits a human operator to specify an arbitrary area in the synthesized image displayed on the display according to the data about the synthesized image. The partial image display reads image data about the specified area in the synthesized image from the image memory and displays it as a partial image.

A scanning electron microscope in accordance with a second embodiment of the present invention comprises a device for directing a sharply focused electron beam onto a specimen, a device for scanning the electron beam across the specimen in two dimensions, a charged-particle detector for detecting charged particles produced by the scanning, an X-ray detector for detecting characteristic X-rays produced by the scanning, a first image memory for storing image data derived from the charged-particle detector by the scanning of the electron beam, a second image memory for storing data about an X-ray map of a certain element based on an output signal produced from the X-ray detector by the scanning of the electron beam, a first display for displaying image data stored in the first image memory and/or X-ray map data stored in the second image memory as an observable still image, a motor-driven specimen-moving device, a specimen motion control device, an image-synthesizing circuit, and a second display. An image acceptance region is established within the area scanned by the beam. The specimen motion control means virtually partitions an area which is scanned by the electron beam and from which an image should be taken into cells defined by grid lines and can scan these cells individually by the electron beam within the image acceptance region. The image-synthesizing circuit stores image data obtained from these cells by the charged-particle detector in locations of the first image memory that are addressed corresponding to the cells, thus creating data about a synthesized image. The image-synthesizing circuit also stores map data about a certain element obtained from these cells by the X-ray detector in locations of the second image memory that are addressed corresponding to the cells, thus creating data about a synthesized map. The data about the synthesized image and/or the data about the synthesized map are supplied to the second display.

Other objects and features of the invention will appear in the course of the description thereof, which follows.

DESCRIPTION OF THE PREFERRED EMBODIMENTS

Figure 1:
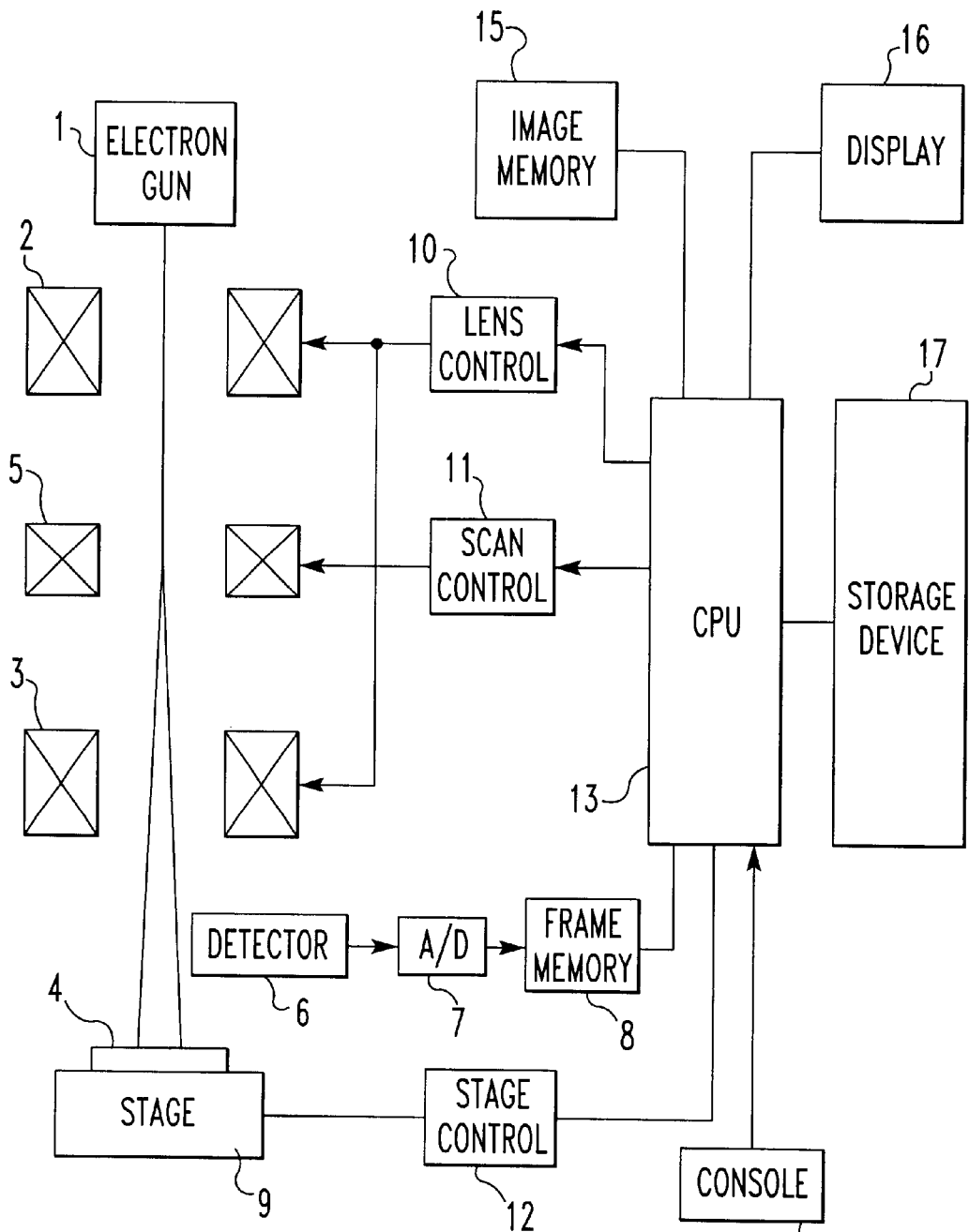
FIG. 1 is a schematic block diagram of a scanning electron microscope in accordance with the present invention.

Referring to FIG. 1, there is shown a scanning electron microscope in accordance with an embodiment of the present invention. This microscope has an electron gun 1 emitting an electron beam that is focused onto a specimen 4 by a system of condenser lenses 2 and an objective lens 3. The electron beam is deflected in the X- and Y-directions across the specimen by deflection coils 5. Secondary electrons and other electrons produced from the specimen 4 as the beam is scanned are detected by a detector 6. The output signal from the detector 6 is converted into digital form by an A/D converter 7 and stored as image data in a frame memory 8. A motor-driven specimen stage 9 carries the specimen thereon and is capable of moving in two dimensions, i.e., in the X- and Y-directions. A lens control circuit 10 controls the excitation of the system of condenser lenses 2 and of the objective lens 3. The deflecting action of the deflection coils 5 is controlled by a scanning control circuit 11. Motions of the specimen stage 9 are controlled by a stage control circuit 12. The lens control circuit 10, scanning control circuit 11, and stage control circuit 12 are operated in accordance with instructions from a central processing unit (CPU) 13. Also shown are an SEM console 14, an image memory 15 for storing data about synthesized images, a display device 16, such as a CRT, and a storage device 17, such as a hard disk drive, for storing data about the original image in a hard disk.

Figure 2:
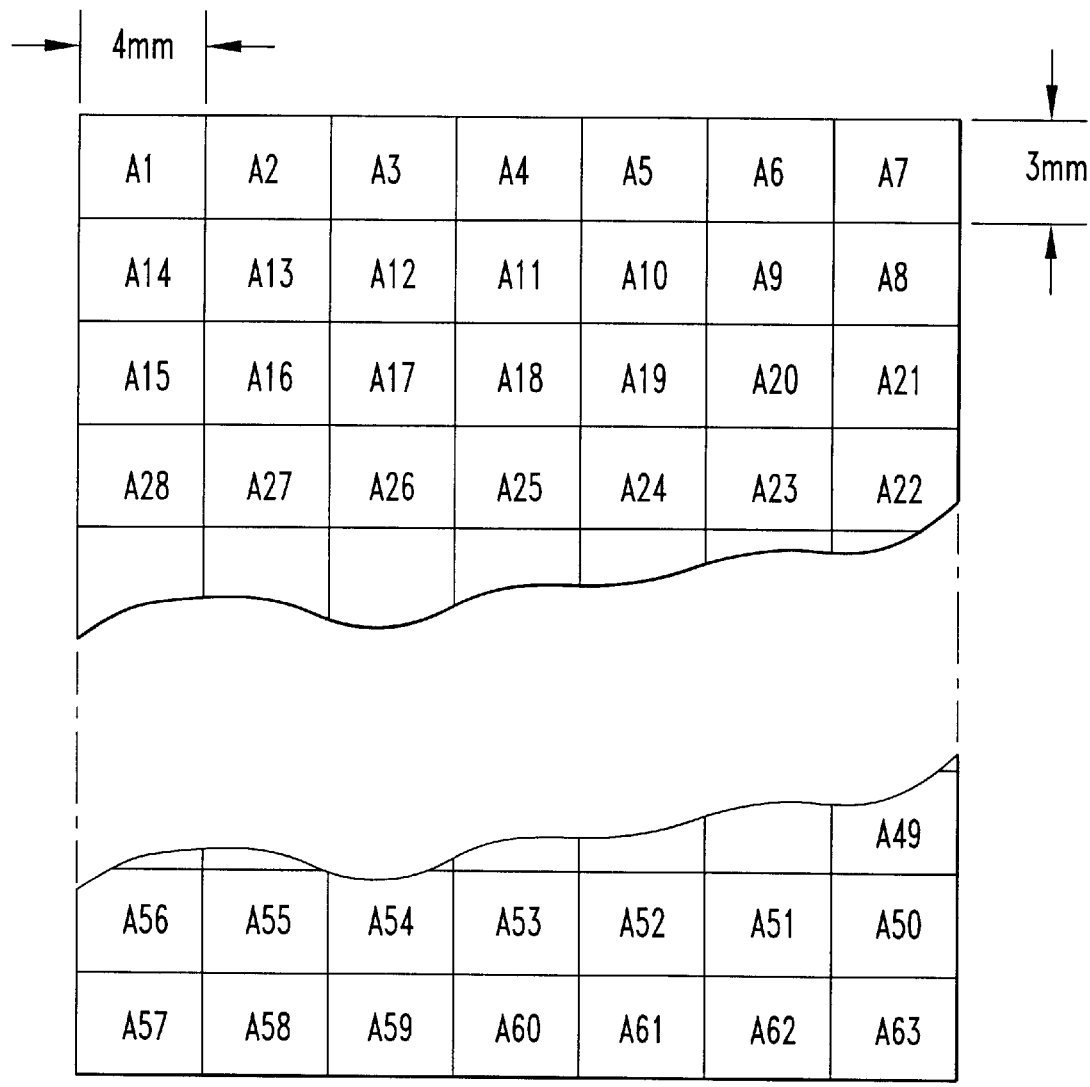
FIG. 2 is a diagram illustrating the manner in which a specimen surface is virtually partitioned into cells by grid lines in the scanning electron microscope shown in FIG. 1.

The operation of the scanning electron microscope constructed in this way is described below. First, an operator operates the SEM console 14 to set the magnification of the image obtained by scanning the electron beam to a minimum magnification (e.g., 50×). It is assumed that an image displayed on the display device 16 measures 150 mm in height and 200 mm in width. At a magnification of 50×, an area scanned by the electron beam on the specimen measures 3 mm by 4 mm. The CPU 13 controls the scanning control circuit 11 such that the area of the specimen scanned by the electron beam becomes equal to this size. In the present invention, this area measuring 3 mm by 4 mm is taken as a unit cell, and the specimen surface is virtually partitioned into cells consisting of seven rows and nine columns, as shown in FIG. 2. These cells are denoted by A1–A63, respectively. The specimen stage is moved in steps of 3 mm vertically and in steps of 4 mm horizontally such that these cells successively arrive at the scan position.

The detector signal produces an image signal indicating image data derived from the scanned area. It is assumed that this scanned area consists of 256×192 pixels. The frame memory 8 has a capacity sufficient to accept data derived from the scanned area of this size. The image memory 15 has a capacity sufficient to store the amount of data about 7×9 frames of image (e.g., 1792 (=256×7)×1758 (=192×9) pixels).

If the operator operates the SEM console 14 to instruct the CPU 13 to create a synthesized image by making use of movements of the specimen, then the CPU 13 performs the following sequence of control operations. The specimen stage 9 is brought to a halt such that the first cell A1 is placed on the area scanned by the electron beam. The beam is scanned across an area (3 mm by 4 mm) of a size corresponding to the minimum magnification described above. Of the obtained image signal, an amount of data corresponding to 192 pixels (vertical)×256 pixels (horizontal) is accepted and once held in the frame memory 8. Then, the data is transferred to the storage device 17 as data about the cell A1 and stored in this memory.

After the electron beam is scanned across the cell A1 and the resulting image signal is accepted, the specimen stage 9 is caused to move 4 mm in the X-direction (to the left in the figure) and brought to a halt. The second cell A2 arrives at the scan position. At this position, the electron beam is scanned across an area of the size measuring 3 mm by 4 mm corresponding to the minimum magnification in the same way as in the above-described processing. Image data obtained from the cell A2 is placed into the storage device 17 via the frame memory 8.

Subsequently, movement in the X-direction over a distance of 4 mm and scan of the electron beam are repeated in exactly the same way up to the cell A7. The obtained image data is accepted into the storage device 17 via the frame memory 8.

After completion of collection of image data from the seven cells A1–A7 arrayed horizontally in this way, the specimen stage is made to move in a step of 3 mm vertically. Image data is taken from the next seven cells A8–A14 by horizontal stepwise movements and by the scan of the electron beam. By repeating these horizontal and vertical stepwise movements, image data derived from the cells A1–A63 is stored in the storage device 17.

Figure 3:
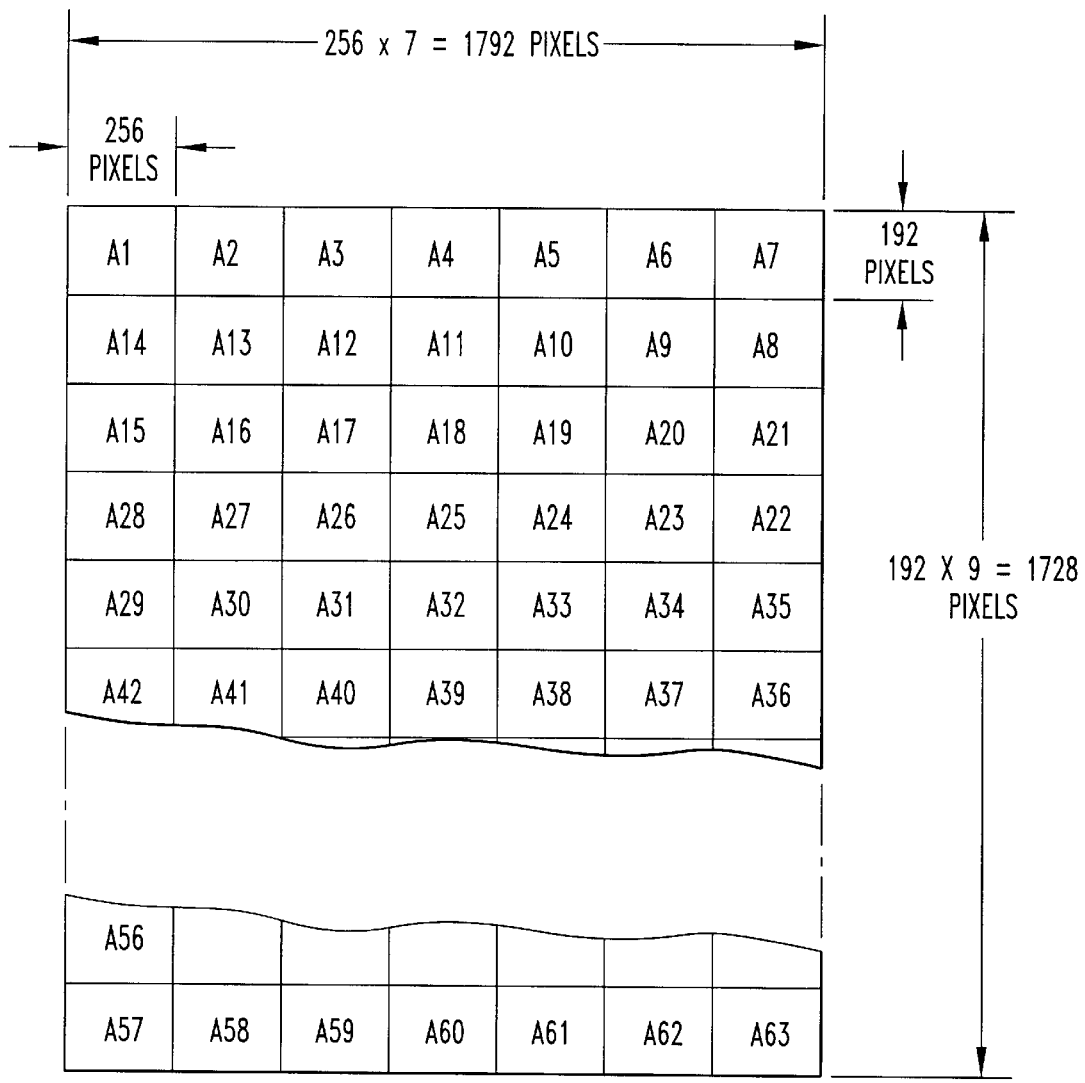
FIG. 3 is a diagram illustrating storage areas formed in an image memory 15 of the microscope shown in FIG. 1.

When image data is being collected in this way, the CPU 13 sends successively image data items on the cells stored in the storage device 17 to the image memory 15 and creates data about a synthesized image by splicing together images originating from the cells. In particular, storage areas for storing image data on the pixels (256×192 pixels), respectively, are established in the image memory 15, as shown in FIG. 3, such that these storage areas show a 1:1 correspondence to the cells, respectively, virtually created on the specimen by grid lines as shown in FIG. 2. The CPU 13 sends the image data items on the cells to the image memory 15 in succession. The data items are written into locations of the image memory that are addressed corresponding to the positions of the cells. Therefore, when the writing for all the cells is completed, a synthesized image (consisting of 1792×1728 pixels) created by splicing together 7×9 frames of image on the cells each measuring 3 mm×4 mm on the specimen is formed in the storage areas of the image memory 15.

Figure 5:
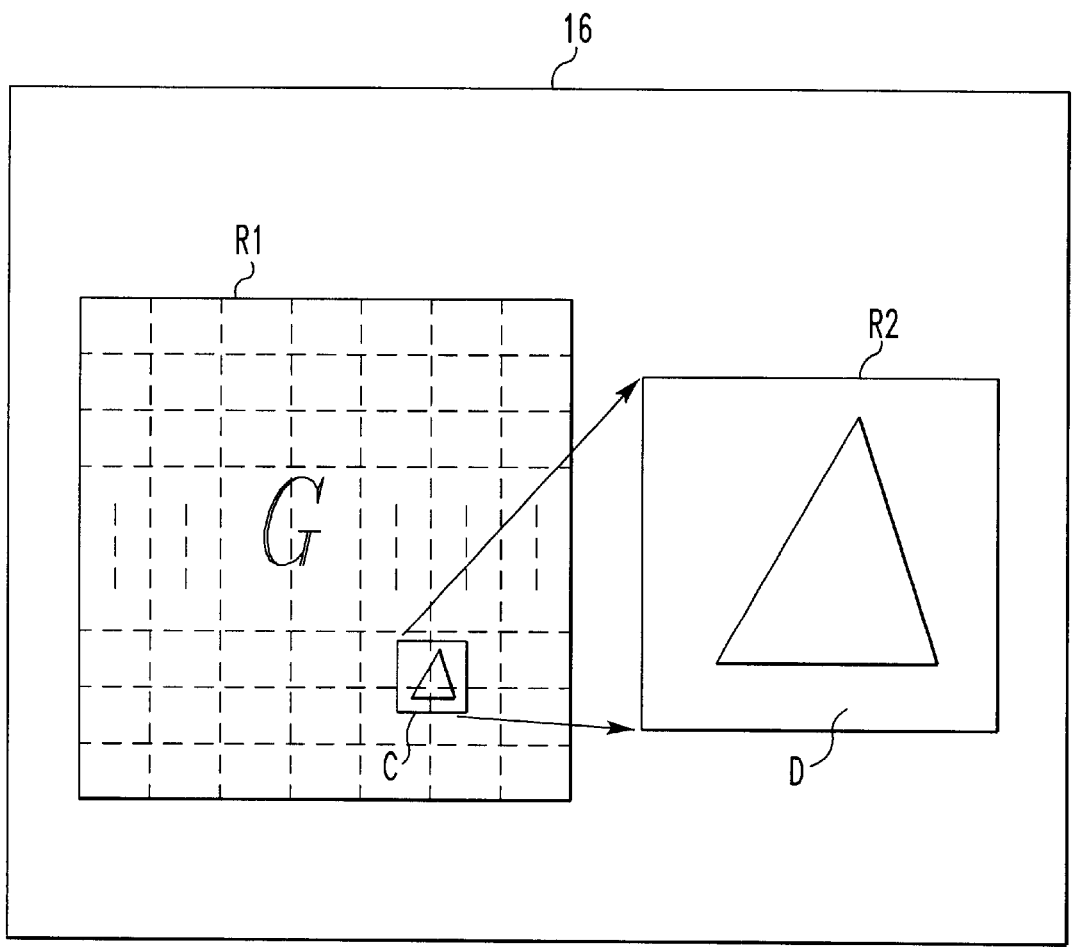
FIG. 5 is a diagram showing a synthesized image G and a partial image displayed on a display device 16 of the microscope shown in FIG. 1.

The synthesized image G stored in the image memory 15 is displayed on a whole image display region R1 on a left portion of the viewing screen of the display device 16 shown in FIG. 5. For example, this whole image display region R1 measures 200 mm by 200 mm. The synthesized image G is a specimen image of a quite low magnification of about seven times. Hence, this single image permits the operator to observe a quite wide area on the specimen surface measuring 27 mm by 28 mm.

The CPU 13 displays a rectangular box cursor C, for example, within the synthesized specimen image displayed on the whole image display region such that the cursor C can be moved and deformed, as shown in FIG. 5. If the operator manipulates this box cursor C so as to surround a portion of interest and commands "display", then the CPU 13 reads image data about the area surrounded by this box from the image memory 15 and sends the data to the display device 16. The image is displayed on an enlargement display portion R2 of the viewing screen that is adjacent to the whole image display region R1. In consequence, an enlarged partial image D of a certain portion of the synthesized specimen image that covers a wide area is displayed adjacently. The operator compares the enlarged partial image with the whole image. He can clearly grasp the positional relation of the portion giving the enlarged partial image to the whole image by referring to the box cursor C within the whole image.

When a desired portion is specified with the box cursor C, if movement of the whole cursor and the size can be specified for each pixel, then the setup can be done closely. However, they have to be specified meticulously. As a simple method of specifying the movement and size, the cursor is moved in steps corresponding to each pixel or plural pixels. Preferably, a method of varying the size may also be used in combination.

If the number of pixels forming an image to be displayed is great compared with the number of pixels that can be displayed on the display region, the display device 16 automatically reduces the number of pixels representing the image such that the data fits within the display region, whether the synthesized whole image or enlarged partial image is displayed.

In the embodiment described above, the area on the specimen scanned by the electron beam measures 3 mm by 4 mm. Image data about 192×256 pixels over the whole scanned area is accepted as image data. Each scanned area measuring 3 mm by 4 mm is taken as a unit cell. The specimen surface is virtually partitioned into cells by grid lines. Therefore, the specimen stage is moved 3 mm vertically and 4 mm horizontally in each step corresponding to the size of each cell for accepting image data.

The area scanned by the electron beam contains an image data acceptance region from which image data is taken. In practical applications, it is desired to set this image data acceptance region narrower than the scanned area for the following reason. The electron beam is scanned across a region measuring 3 mm by 4 mm. Image data is taken only from an area inside the scanned region, the area occupying 90% of the scanned region. If the electron beam scans the wide area measuring 3 mm by 4 mm in this way, the position hit by the electron beam deviates from the intended position by the deflection distortion especially when the beam scans marginal portions. If image data derived from such marginal portions were used, then the final image would be distorted. Such distortion can be prevented by taking image data only from a central portion.

In this case, the region scanned by the electron beam measures 3 mm by 4 mm. On the other hand, the region from which image data is taken excludes marginal 10% and measures 2.7 mm in height and 3.6 mm in width. Therefore, each unit cell used for synthesization of an image measures 2.7 mm in height and 3.6 mm in width. Correspondingly, the specimen stage moves a step of 2.7 mm vertically and a step of 3.6 mm horizontally.

Figure 4A:
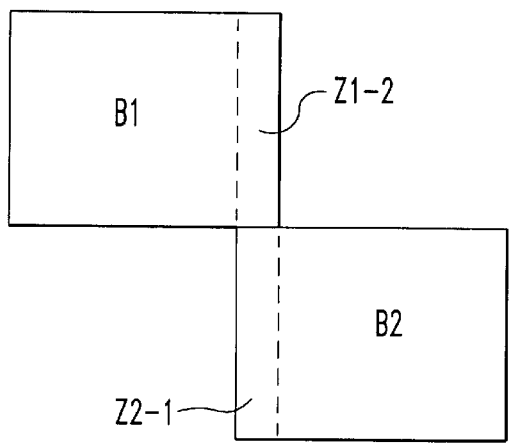
FIGS. 4(a), 4(b), and 4(c) are diagrams illustrating the manner in which image portions derived from adjacent cells overlap with each other, as well as the manner in which the image portions are spliced together by the scanning electron microscope shown in FIG. 1.

Two adjacent cells (e.g., A1 and A2) are scanned by the electron beam. Two images B1 and B2 are taken from the whole scanned region. If these two images B1 and B2 are placed in a fully offset relation to each other as shown in FIG. 4(a), partial images $Z_{1-2}$ and $Z_{2-1}$ are present on the side in contact with the adjacent images. The partial images $Z_{1-2}$ and $Z_{2-1}$ have a width of 0.4 mm and have been derived from the same specimen region. For ease of understanding, the two images are drawn to be shifted by a distance equal to one cell vertically in FIG. 4(a), 4(b) or 4(c).

These partial images $Z_{1-2}$ and $Z_{2-1}$ are derived from the same specimen region at the same magnification. Therefore, if one of them is deleted and the two images B1 and B2 are attempted to be spliced together, then the two images should be neatly merged together. However, stronger distortion occurs at the marginal portions as mentioned above. Consequently, it is desired to adopt the following means.

Figure 4B:
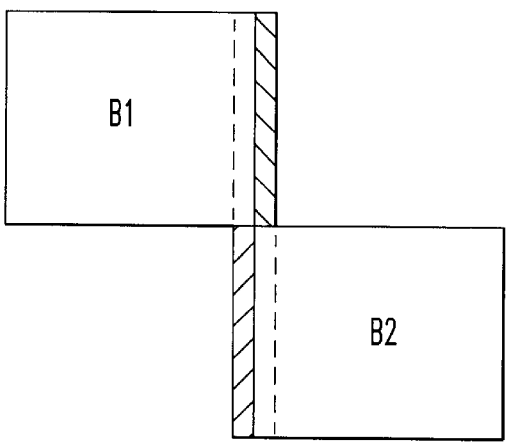
Figure 4C:
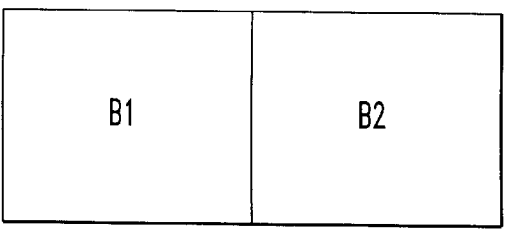

When the CPU 13 sends image data derived from adjacent cells to the image memory where they are combined into one, the outer half portion of the partial image $Z_{1-2}$ indicated by hatching in FIG. 4(b) and the outer half portion of the partial image $Z_{2-1}$ indicated by hatching are deleted, and the images B1 and B2 are spliced together as shown in FIG. 4(c). In this way, images obtained from the successively adjacent regions are spliced together in succession. Of course, where two images adjacent vertically are spliced together, halves of overlapping portions on the adjacent side are deleted, and the two images are spliced together in the same way as where two images adjacent horizontally are treated as described above.

In the above description, halves of overlapping portions of two images are deleted and then the two images are spliced together. With respect to an image written into the image memory 15 earlier, it is not necessary to erase the overlapping portion on writing. That is, after writing the whole image B1 first into the image memory 15, the image B2 whose overlapping portion has been half erased is written to overwrite the image B2 such that the end of the image B2 overlaps the portion of the image B1 to be deleted.

This case corresponds to the above-described embodiment in which the overlap ratio is set to zero. In this case, all image data obtained from the region scanned by the electron beam is accepted as image data about the cells. The distances over which the specimen stage moves are equal to the dimensions of the scanned region, which are 3 mm in height and 4 mm in width in the above embodiment. Where the overlap ratio is not zero, the stage control circuit 12 sets the amounts of movements of the specimen stage in such a way that they are made smaller than the dimensions of the range scanned by the beam according to the set overlap ratio. The CPU 13 calculates the width of the overlapping portions according to the overlap ratio. Data about halves of the overlapping portions is deleted. Then, two images are spliced together. What are deleted are not limited to halves of the overlapping portions. For example, where the distorted portion at the right end of the image and the distorted portion at the left end are not equivalent, the more distorted portion may be deleted by a larger amount, and the two images may be spliced together.

By performing a splicing operation while deleting data about the marginal portions as described above, image distortion due to deflection distortion of the scanned region at low magnifications, especially at marginal portions, is mitigated. In practical situations, it is desired that one can switch the overlap ratio (the ratio of deletion) between plural values within the range from 0 to about 50% or set the overlap ratio at will through the CPU 13. It is also conceivable that the overlap ratio is fixed at an appropriate value.

Where images are partially erased taking account of the overlapping portions and the images are spliced together in this way, it is obvious that the amount of data about the synthesized image decreases with the overlap ratio.

Furthermore, it is not always necessary that the electron beam scan all cells virtually created on the specimen. Rather, the beam may scan only specified cells. Image data obtained by the scanning may be stored in locations of the image memory 15 that are addressed corresponding to the positions of the specified cells, and a synthesized image may be created in the image memory. In this case, the specimen is moved while skipping unwanted portions during measurement. Hence, the measurement time can be shortened.

If the image quality of one of the overlapping portions of two adjacent cells is better than that of the other, the overlapping portion of lower quality may be fully erased, and only the overlapping portion of better quality may be accepted.

Figure 6:
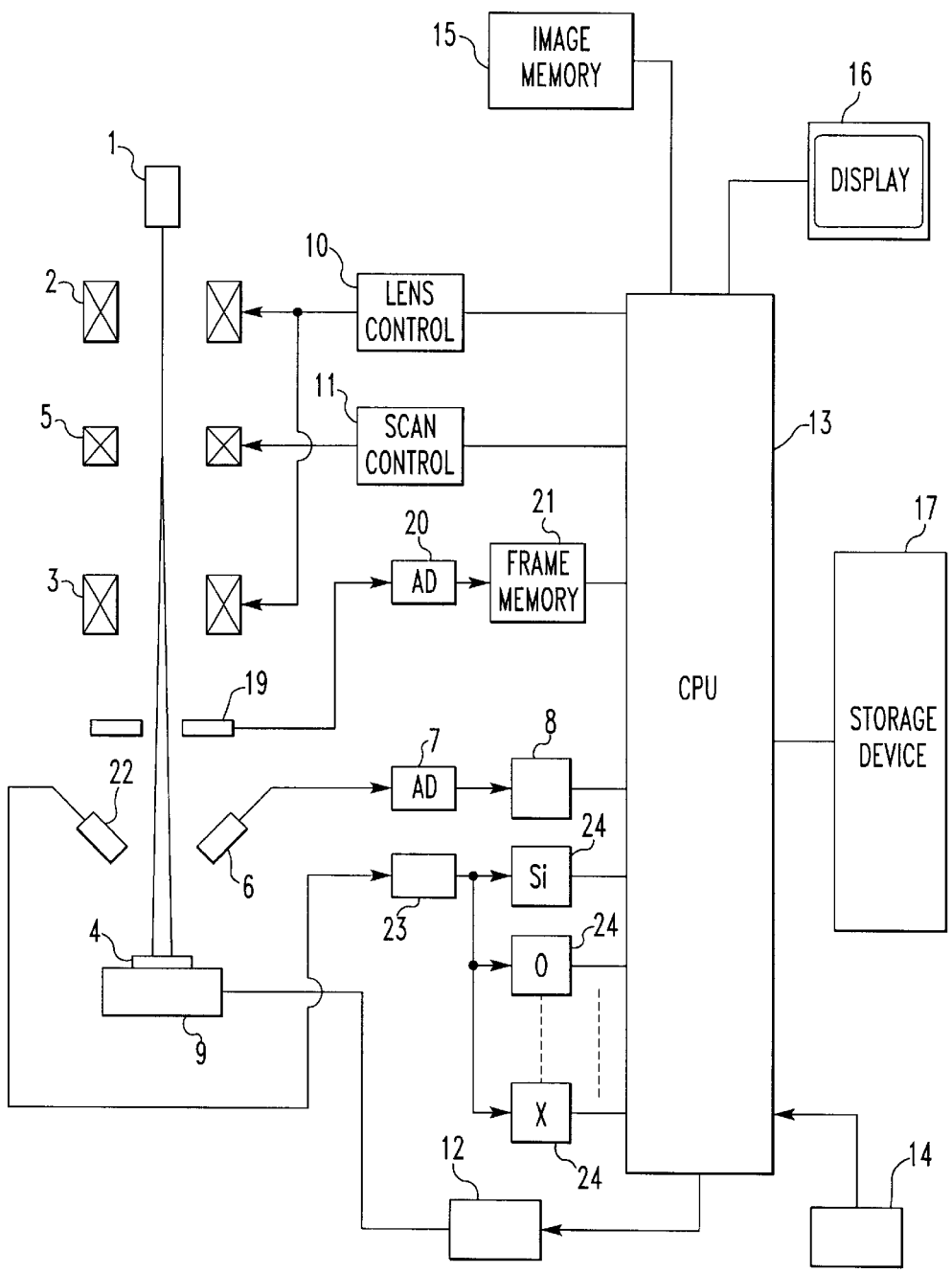
FIG. 6 is a schematic block diagram of another scanning electron microscope in accordance with the present invention.

Referring next to FIG. 6, there is shown a scanning electron microscope in accordance with another embodiment of the present invention. This microscope is similar to the microscope already described in connection with FIG. 1 except that a reflected electron detector 19, an X-ray detector 22, and associated components are added. The reflected electron detector 19 and the X-Ray detector 22 detect reflected electrons and characteristic X-rays, respectively, produced from the specimen when irradiated with an electron beam. The output signal from the reflected electron detector 19 indicating reflected electrons is sent via an A/D converter 20 and a frame memory 21 to a storage device 17, where the signal is stored. The output signal from the X-ray detector 22 is sent to an X-ray analyzer 23, such as a pulse height analyzer, that creates a map for each individual chemical element from the energies of characteristic X-rays. Frame memories 24(Si), 24(O), . . . , 24(X) mounted for individual chemical elements, respectively, are connected with the X-ray analyzer 23. Thus, data about the produced X-rays is stored in the storage device 17.

Figure 7:
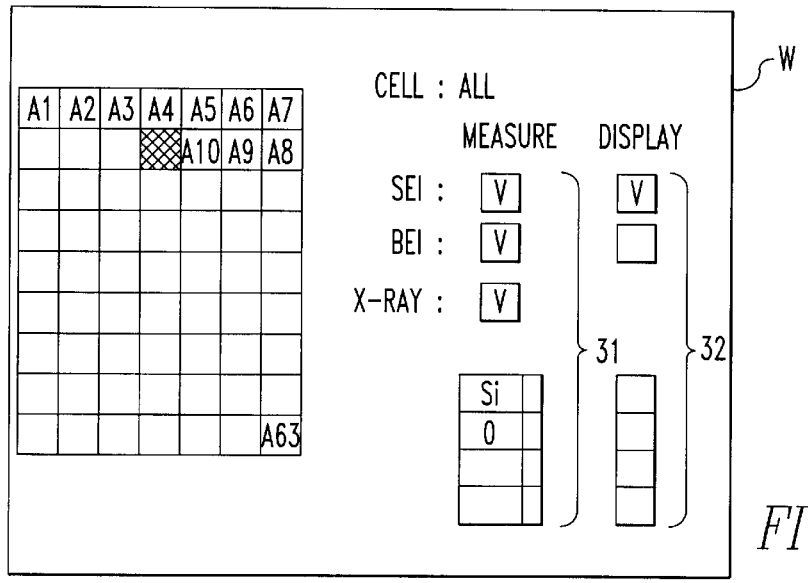
FIG. 7 is a diagram illustrating a measurement/display setting-input window W shown on a display device 16 shown in FIG. 6.

In this structure, a measurement/display setting-input window W is displayed on the display device 16 as shown in FIG. 7 prior to measurement. The operator specifies the kind of signal to be measured from each cell. Seven×nine cells arranged in a matrix are displayed on the input window W to permit the operator to specify these cells graphically and individually. The numbers given to specified cells are displayed to the right of the input window W. Shown below the cell numbers are measured species boxes 31 and display selecting boxes 32. The measured species boxes 31 permit the operator to specify whether individual measurable signal species (i.e., secondary electrons (SEI), reflected or backscattered electrons (BEI), and characteristic X-rays (kinds of elements to be analyzed)) need to be measured. The display selecting boxes 32 allow the operator to select a desired signal species based on which a display is provided.

The operator can specify what kind of image data or map data is measured from what of the 7×9 cells and what kind of data is used in providing a display regarding the cell, using this input window. Under the state of FIG. 7, cell A11 is selected by a pointer. With respect to this cell, SEI, BEI, and characteristic X-rays (analyzed elements are Si and O) are specified as measured signal species. What is displayed is SEI. With respect to cells for which no measured signal species are specified, no measurement needs to be performed. Therefore, the aforementioned stage control circuit 12 forming a specimen motion control device controls the specimen stage to move it directly to the cells where measurement should be performed and bring it to a halt.

Figure 8:
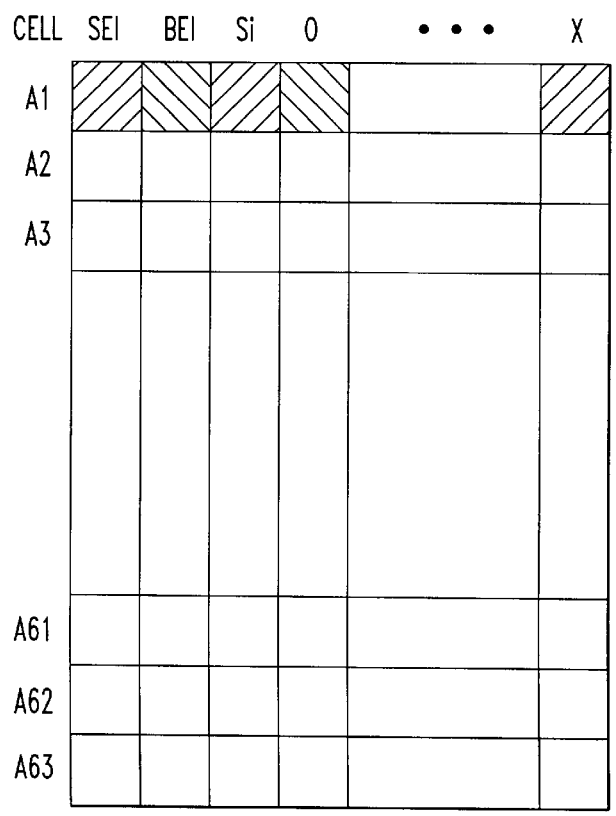
FIG. 8 is a diagram illustrating storage areas in a storage device 17 shown in FIG. 6.

In the example illustrated in FIG. 7, only one cell is specified. Preferably, plural cells can be specified at a time. It is now assumed that all the cells are set similarly to the cell A11 described above. The electron beam scanning horizontal stepwise movement, and vertical stepwise movement are repeated in exactly the same procedures as in the first-mentioned embodiment. As a result, image data and map data are taken from the cells A1–A63. Whenever a measurement is made for a cell, image data based on secondary electrons is once held in the frame memory 8. Image data based on reflected electrons is held in the frame memory 21. Map data arising from silicon and oxygen and contained in characteristic X-rays are held in the frame memories 24(Si) and 24(O), respectively. Then, the data are rearranged for the individual cells and kinds of data in the storage areas within the storage device 17 and stored as illustrated in FIG. 8, for example.

Whenever measurement about one cell is completed, the CPU 13 reads image data (SEI) from the storage device 17 that is used to provide a display for each individual cell. The CPU 13 writes the data in corresponding locations of the image memory 15, thus creating data about a synthesized image. Accordingly, when measurements for all the cells are completed, a synthesized image about secondary electrons is created within the image memory 15. Based on the data about the synthesized data, a synthesized whole image G and a partial image D of a region specified with the box cursor C within the whole image are displayed on the viewing screen of the display device 16, as shown in FIG. 5.

After the measurements, if the signal species to be displayed is varied, the input window W is displayed on the display device 16. The operator specifies a desired cell. With respect to this cell, the displayed signal species is changed to another. If all the cells are specified and data about BEI (backscattered electrons) is displayed, a synthesized image based on backscattered electrons is displayed. If the operator specifies only one cell and instructs data about Si to be displayed, then only this cell is displayed as a map of silicon.

Where different kinds of image data are synthesized and displayed in this way, an image based on secondary electrons is displayed in black and white. An image based on backscattered electrons is displayed in only orange. A map image of silicon is displayed only in green. In this way, each different kind of image data is displayed in a different color. The operator can easily discern what cells are being displayed with what kinds of image data.

In the description above, different kinds of image data are synthesized for each cell. They may also be synthesized for each region of any arbitrary size. For example, where the synthesized whole image G and a partial image are displayed by specifying an arbitrary region within the whole image as shown in FIG. 5, the displayed signal species about the region of the partial image may be varied.

It takes longer to gain X-ray map data at good signal-to-noise ratio than where image data about secondary electrons or reflected electrons is gained. Therefore, it is conceivable that X-map data is taken only from necessary cells later. For example, image data about secondary electrons emanating from all the cells is first taken. A synthesized whole image based on the secondary electrons is displayed on the display device 16. The operator observes the image and selects a desired cell from which an X-ray map should be taken. Then, data about the X-ray map is taken only from the selected cell.

In this case, the specimen stage is moved to bring the cell from which X-ray map data should be newly taken into the region scanned by the electron beam such that this cell is scanned by the beam. At this time, because of poor reproducibility of specimen stage motion, the position at which the specimen stage comes to a stop may deviate from the position assumed previously during measurement of secondary electrons. Consequently, the specified cell may not be correctly scanned by the beam.

Accordingly, it is conceivable that an accurate positional registration is effected by image matching procedures as described below. After the specimen stage comes to a stop at a specified cell (e.g., A23), the position is scanned with the electron beam and secondary electrons are detected before gaining data about an X-ray map. Image data based on the detected secondary electrons is once held in the frame memory 8. The image data is read from the frame memory 8 and sent to the display device 16 under instructions from the CPU 13. A specimen image based on secondary electrons emanating from this cell is displayed. Data about a secondary electron image has been already derived from this cell A23 and is stored in the image memory 15 or storage device 17. The data about the secondary electron image is read from the image memory 15 or storage device 17 and superimposed as a reference image for the cell A23 on the newly-gained specimen image described above. The resulting image is displayed on the display device 16.

At this time, if the position at which the specimen stage comes to a stop does not deviate, then two specimen images should overlap each other exactly. However, if such a deviation occurs, the two specimen images are offset from each other. Accordingly, the operator moves one image to bring the two specimen images into exact register, thus doing image matching. The CPU 13 finds the amount of offset of the newly-gained specimen image from the reference image, based on the amount of movement of the specimen image that is necessary to bring the two images into register. The CPU 13 then instructs the scanning control circuit 11 to shift the scanned region based on the found amount of offset.

Consequently, the cell scanned by the electron beam agrees with the cell from which the reference image was gained. Subsequently, the electron beam is scanned across this cell. The resulting characteristic X-rays are measured, and data about an X-ray map of a desired element is obtained. It follows that the obtained X-ray map data has been derived from exactly the same cell that gave the reference image based on secondary electrons. Of course, the image matching processing can be automatically performed by a computer program.

As described in detail thus far, in a scanning electron microscope in accordance with the first embodiment of the present invention, a specimen image that covers a wide area is created at a magnification lower than the minimum magnification determined by the scanning width of the electron beam. The operator observes this image and selects a desired region contained in this image. An enlarged partial image of this selected region is displayed.

In a scanning electron microscope in accordance with the second embodiment of the present invention, an elemental map and a secondary electron image or reflected electron image which cover a wide area are created at a magnification lower than the minimum magnification determined by the scanning width of the electron beam.

Having thus described our invention with the detail and particularity required by the Patent Laws, what is desired to be protected by Letters Patent is set forth in the following claims.

What is claimed is:

1. A scanning electron microscope having a means for directing a sharply focused electron beam onto a specimen, a means for scanning said electron beam across the specimen in two dimensions, an image memory for storing image data obtained from the specimen by the scanning, a display means for displaying a specimen image based on the image data stored in said image memory, and a motor-driven specimen-moving device, said scanning electron microscope comprising:

means for controlling the specimen-moving device virtually partitioning an area on the specimen to be scanned by the electron beam and from which an image may be taken into virtual cells defined by virtual grid lines and for moving said specimen to scan the cells individually by the electron beam;

an image-synthesizing means for storing image data obtained from said virtual cells in locations of the image memory that are addressed corresponding to said virtual cells, thus creating data defining a synthesized image;

a specifying means permitting an operator to specify an arbitrary area in the synthesized image displayed on the display means according to the data about the synthesized image; and a partial image display means for reading image data about the area specified by the operator from said image memory and displaying the image data as a partial image.

2. The scanning electron microscope of claim 1, wherein said means for controlling the specimen-moving device moves said specimen such that adjacent ones of said virtual cells are successively scanned by the electron beam.

3. The scanning electron microscope of claim 1 or 2, further comprising a microscope magnification-setting means and wherein said means for controlling the specimen-moving device moves said specimen according to a cell size found based on a magnification set by a microscope magnification-setting means.

4. The scanning electron microscope of claim 1 or 2, wherein the display means may be controlled to simultaneously display said synthesized image and said partial image simultaneously on the viewing screen of a display device.

5. The scanning electron microscope of claim 1 or 2, wherein said specifying means is a rectangular cursor of variable size.

6. The scanning electron microscope of claim 1 or 2, wherein said image-synthesizing means deletes data about image lying outside an image acceptance region from image data obtained from said area scanned by the electron beam and synthesizes an image.

7. The scanning electron microscope of claim 6, further comprising a means for specifying a ratio of said image acceptance region to the area scanned by said electron beam.

8. The scanning electron microscope of claim 1 or 2, wherein:

(A) there is further provided a cell-specifying means permitting an operator to specify a desired one of said virtual cells;

(B) said specimen motion control means controls movement of the specimen such that the cell specified by said cell-specifying means is scanned by the electron beam; and (C) said image-synthesizing means stores image data obtained from this cell in a location of the image memory that is addressed corresponding to the virtual cell, thus creating data about a synthesized image.

9. The scanning electron microscope of claim 8, further comprising:

a comparison means for comparing image data obtained by scanning the virtual cell specified by said cell-specifying means after the specimen is moved by the specimen motion control means with image data already obtained from the same cell and finding misregistration, if any, between the two images; and a means for correcting the position of the area on the specimen scanned with the electron beam according to information about the misregistration obtained from said comparison means.

10. The scanning electron microscope of claim 9, wherein said image data is obtained by detecting any one of secondary electrons, reflected electrons, and characteristic X-rays produced from the specimen.

11. A scanning electron microscope comprising:

a means for directing a sharply focused electron beam onto a specimen;

a means for scanning the electron beam across the specimen in two dimensions to produce charged particles and X-rays;

a charged-particle detector for detecting said produced charged particles;

an X-ray detector for detecting said produced characteristic X-rays;

a first image memory for storing image data derived from said charged-particle detector during the scanning of the electron beam;

a second image memory for storing data about an X-ray map of a certain element based on an output signal from the X-ray detector during the scanning of the electron beam;

a display means for displaying at least one of image data stored in the first image memory and X-ray map data stored in the second image memory as an observable still image;

a motor-driven specimen-moving device;

means for controlling the specimen-moving device virtually partitioning an area on the specimen to be scanned by the electron beam and from which an image may be taken into virtual cells defined by virtual grid lines and for moving the specimen such that the cells can be individually scanned by the electron beam;

an image-synthesizing means for storing image data obtained from said virtual cells by the charged-particle detector in locations of the first image memory that are addressed corresponding to said virtual cells, thus creating data defining a synthesized image, said image-synthesizing means acting also to store map data about a certain element obtained from these cells by the X-ray detector in locations of the second image memory that are addressed, thus creating data about a synthesized X-ray map; and a display means to which data about the synthesized image and the data about the synthesized X-ray map can be supplied.

12. The scanning electron microscope of claim 11, further comprising:

a specifying means permitting an operator to specify a desired region within the synthesized image displayed on said display means based on said synthesized image data or synthesized X-ray map data; and a means for reading the synthesized image data or synthesized X-ray map data corresponding to the specified region within said synthesized image from said first image memory or said second image memory and displaying the data as a partial image.

13. The scanning electron microscope of claim 11, further comprising:

a specifying means permitting an operator to specify a desired region with the synthesized image displayed on said display means based on said synthesized image data; and a means for reading the synthesized image data or synthesized X-ray map data corresponding to the specified region within said synthesized image from said first image memory or said second image memory and displaying the data as a partial image.

14. The scanning electron microscope of claim 11 or 12, wherein:

(A) there is further provided a specifying means permitting an operator to specify a desired one of said cells and to specify whether measurements of charged particles and characteristic X-rays from the specified cell are necessary;

(B) said specimen motion control means controls movement of the specimen such that the cell specified by said specifying means is scanned by the electron beam; and (C) said image-synthesizing means stores at least one of image data and X-ray map data obtained from this cell by the measurements specified by the specifying means in locations of the image memory that are addressed corresponding to the cell, thus creating data about at least one of synthesized image and synthesized map.

15. The scanning electron microscope of claim 14, further comprising:

a comparison means for comparing image data obtained by scanning the virtual cell specified by said specifying means after the specimen is moved by the specimen motion control means with image data already obtained from the same cell and for finding misregistration, if any, between the two images; and a means for correcting the position of the area on the specimen scanned with the electron beam according to information about the misregistration obtained from said comparison means.

16. The scanning electron microscope of claim 15, wherein said charged particles are secondary electrons or reflected electrons.

* * * * *

UNITED STATES PATENT AND TRADEMARK OFFICE
CERTIFICATE OF CORRECTION

PATENT NO.     : 6,528,787 B2
DATED          : March 4, 2003
INVENTOR(S)    : Masumi Katagami et al.

It is certified that error appears in the above-identified patent and that said Letters Patent is hereby corrected as shown below:

<u>Title page,</u>
Item [73], Assignees, "Jeol Ltd." should read -- JEOL Ltd. --.
Assignees, "Jeol Engineering Co., Ltd." should read
-- JEOL Engineering Co., Ltd. --.
Item [30], insert:
-- [30] Foreign Application Priority Data,
        11/30/99        JP 11-340571
        12/27/99        JP 11-369923 --.

Signed and Sealed this

Twenty-sixth Day of August, 2003

JAMES E. ROGAN
*Director of the United States Patent and Trademark Office*